(12) United States Patent
Gupta et al.

(10) Patent No.: US 7,368,976 B2
(45) Date of Patent: May 6, 2008

(54) METHOD AND APPARATUS FOR PROVIDING COMPENSATION AGAINST TEMPERATURE, PROCESS AND SUPPLY VOLTAGE VARIATION

(75) Inventors: Sushil K. Gupta, Noida (IN); Paras Garg, Noida (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 149 days.

(21) Appl. No.: 11/290,619

(22) Filed: Nov. 29, 2005

(65) Prior Publication Data

US 2006/0226889 A1    Oct. 12, 2006

(30) Foreign Application Priority Data

Nov. 29, 2004    (IN)    ..................... 2384/DEL/2004

(51) Int. Cl.
*H03K 3/01*    (2006.01)

(52) U.S. Cl. ..................................... 327/534; 327/544
(58) Field of Classification Search .............. 327/545, 327/546, 362, 205, 206, 534, 544
See application file for complete search history.

(56) References Cited

U.S. PATENT DOCUMENTS

| | | | |
|---|---|---|---|
| 5,461,338 A * | 10/1995 | Hirayama et al. | 327/534 |
| 5,610,533 A * | 3/1997 | Arimoto et al. | 326/33 |
| 5,612,643 A * | 3/1997 | Hirayama | 327/534 |
| 5,874,851 A * | 2/1999 | Shiota | 327/537 |

* cited by examiner

*Primary Examiner*—Dinh T. Le (57) ABSTRACT

In the present invention an apparatus and method for providing compensation against temperature, process and supply voltage variation in MOS circuits has been proposed. The invention provides a change in process, temperature and voltage detection circuit, which controls the body bias and the drive of the devices in the CMOS circuit. The detection circuit is independent of any input or internal signal of the CMOS circuit to be controlled.

20 Claims, 10 Drawing Sheets

METHOD AND APPARATUS FOR PROVIDING COMPENSATION AGAINST TEMPERATURE, PROCESS AND SUPPLY VOLTAGE VARIATION

CROSS-REFERENCE TO RELATED APPLICATIONS

The present application claims priority under 35 U.S.C. §119(a) to Indian Patent Application No. 2384/DEL/2004, filed Nov. 29, 2004, entitled "METHOD AND APPARATUS FOR PROVIDING COMPENSATION AGAINST TEMPERATURE, PROCESS AND SUPPLY VOLTAGE VARIATION". Indian Patent Application No. 2384/DEL/2004 is assigned to the assignee of the present application and is hereby incorporated by reference into the present disclosure as if fully set forth herein.

FIELD OF THE INVENTION

The present invention relates to a method and apparatus for providing compensation against temperature, process and supply voltage variation.

BACKGROUND OF THE INVENTION

When a signal is transmitted long distance through copper traces or transmission line, noise is introduced in the signal. The receiver at the receiving end does not see a perfect square wave. The signal gets worst when ground bounce and supply bounce (because of pin package inductance) make logic high and low level a damped sinusoidal. In such cases, a Schmitt trigger circuit is frequently used at the receiver end to filter the noise.

A Schmitt trigger is an electronic circuit used to turn a signal having slow or asymmetrical transition into a signal with a sharp transition region. Schmitt trigger circuit cleans up the input signal from noise and provides very sharp transition. However, Schmitt trigger circuits are slower and consume more power compared to similar non-Schmitt circuit. Moreover, Schmitt circuit characteristic is very much dependent on process and temperature variations because process and temp directly affects the threshold voltages, which is not under control. Once chip is fabricated, process is fixed but operating temp and voltage change the low and high level transition point and hence the hysteresis. For very slow transition and long distance transmission, a Schmitt trigger circuit with large value of hysteresis is required.

Figure 1:
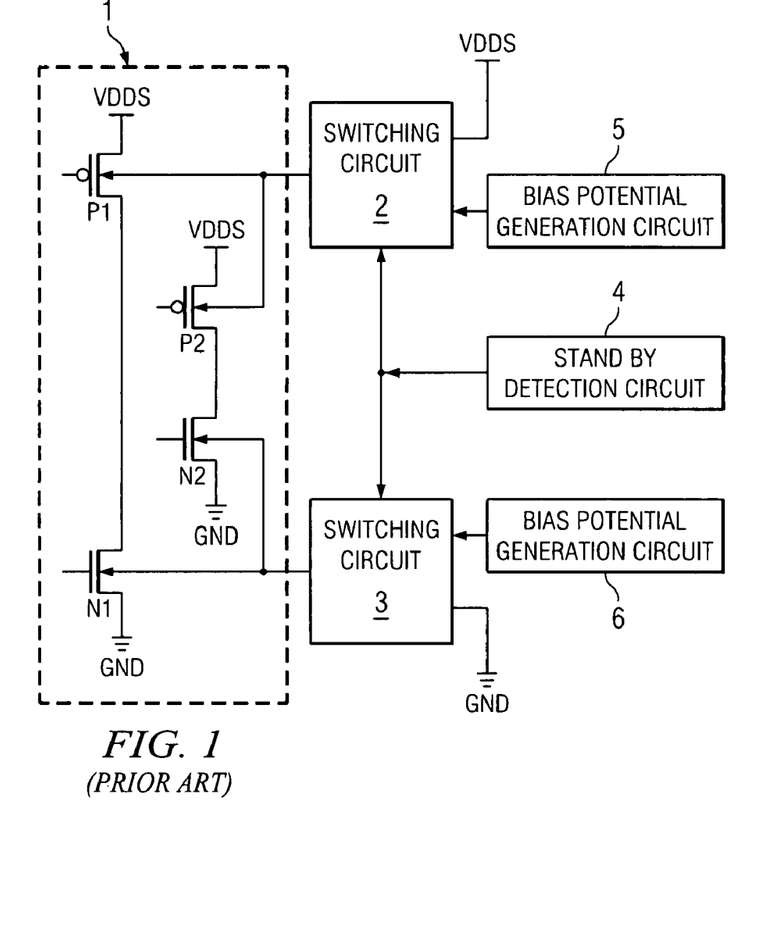
FIG. 1 shows the block diagram of the prior art U.S. Pat. No. 5,461,338 based on substrate-bias control method.

FIG. 1 shows the diagram referred to in the U.S. Pat. No. 5,461,338. Bias potential generation circuits 5 and 6 generate bias voltage only if the circuit is in normal mode (not in standby mode). This bias generation circuits 5 and 6 generate two separate signals for the well of PMOS and substrate of NMOS which forward biases the body-source of the CMOS transistors. It helps in reduction of the threshold voltages of the CMOS devices and hence better speed is achieved. According to the claim of this circuit, bias potential must be smaller than the flat band voltage between semiconductor substrate and source junction of the devices. This bias potential is not generated in standby mode to reduce power. A switching circuit has been introduced between the body of the devices and the source junction to take care of the standby signal. A separate circuit generates the said standby signal 4.

This concept saves power in standby mode and achieves significant improvement in the speed especially when a high voltage device is operated at low voltages. But this circuit does not take care of the process, temperature or supply voltage variations. So it is very sensitive to the process and environmental conditions. It may lead to more power consumption if bias voltage becomes greater than the flat-band voltage.

Figure 2:
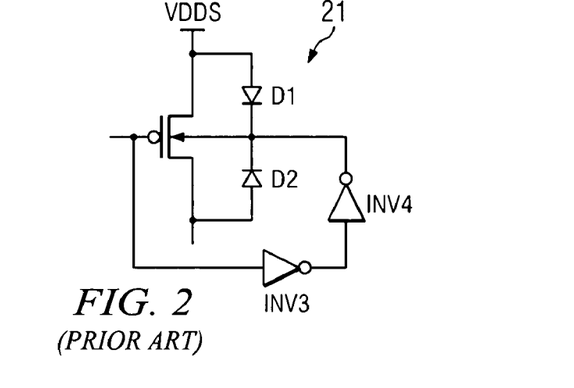
FIG. 2 shows the block diagram of the prior art U.S. Pat. No. 6,515,534 based on substrate-bias control method.

FIG. 2 is another prior art U.S. Pat. No. 6,515,534 on the device control to make speed better even at very low supply voltages. Diodes D1 and D2 are the parasitic diodes formed between body and source/drain junction of the PMOS transistor 21. INV3 and INV4 are the two CMOS inverters, which detect the gate signal of the PMOS transistor 21 and generate the bias signal for the body of the PMOS transistor 21. Whenever gate signal goes low to turn PMOS transistor 21 ON, the body (well) of the PMOS transistor 21 also goes low and diodes D1 and D2 are forward biased. This reduces the threshold voltage of the PMOS transistor 21 and provides more drain current through diodes D1 and D2, which increase the speed of the PMOS transistor 21.

This circuit detects the signal from the gate of the device and biases the body accordingly so that device is faster. Since large amount of current flows through the diodes, if MOS size is large (as in case of IOs), latchup can be a problem. This circuit also does not take care of the changes in process and environmental conditions.

Since Schmitt trigger circuit has been taken an example for the one embodiment of the new concept, few prior art on Schmitt trigger circuits have been discussed.

Figure 3:
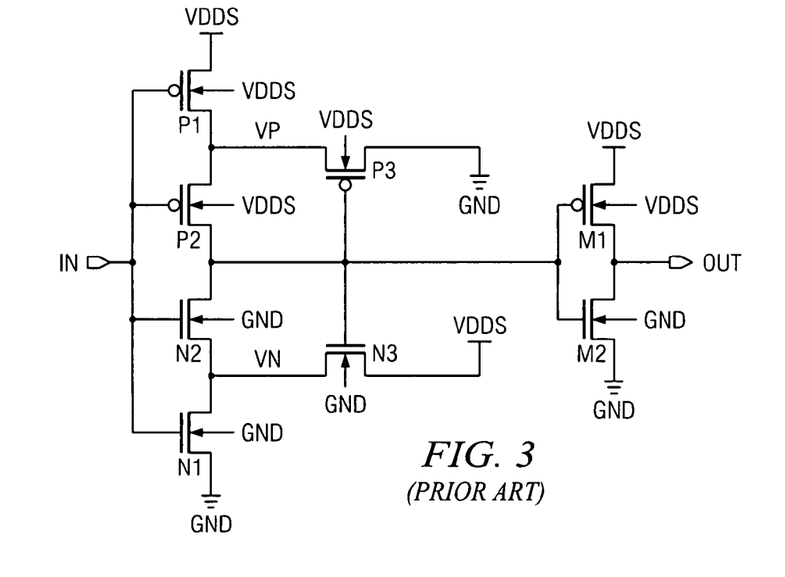
FIG. 3 is a schematic of a widely used conventional Schmitt trigger circuit.

FIG. 3 is a schematic of a widely used conventional Schmitt trigger circuit. Four stacked parallel input MOSFETS P1, P2, N1 and N2 are coupled by their respective gate electrodes to the trigger input IN. Depending on the transition of IN, VP or VN signals are generated which are controlled by the transistor size ratio P3/P1 and N3/N1. M1 and M2 make an inverter to provide a sharp transition at OUT. P3 and N3 form a feedback structure to control PMOS and NMOS. If IN is low then P3 is OFF and N3 is ON, OUT is low. As IN increases, NMOS N1 begins to turn ON and VN starts to fall down. The trip point is defined when IN=Vtn2+VN that is when NMOS N2 turns ON. When N2 turns ON, drain of N2 starts falling down and turns NMOS N3 OFF. Once N2 is ON, transition is very fast. If transistor size of N2 is large compared to N1 and N3 then trip point (Vih) is accurately decided by the ratio of N3/N1. Similarly Vil is decided by the ratio of P3/P1. This circuit is sensitive to the VDDS (positive supply voltage) and process because Vth of P3 and N3 keeps on changing as node VP or VN goes up or comes down respectively with IN. At low supply voltage this circuit does not work properly.

All the above circuits including Schmitt trigger as discussed above are sensitive or more sensitive to process, temperature and voltage variations. In a noisy environment, a very stable circuit is required which should be independent of process and environmental conditions for optimum performance. In such a case a process and environmental adaptive circuit is required which will stabilize the output.

Also most of the prior arts provide large values of hysteresis at high voltage of operation, but are not efficient at low voltage (1.8V or 2.5V) because of threshold variation.

SUMMARY OF THE INVENTION

To address the above-discussed deficiencies of the prior art, it is an object of the present invention to provide a method for MOS circuit control which controls the body bias and the drive of the devices according to the change in process, temperature and supply voltage thereby making the circuit robust and more efficient.

Another object of the invention is to make the detection circuit independent of any input or internal signal of the CMOS circuit to be controlled.

Yet another object of the invention is to eliminate the need of feedback and standby signals.

Further object of the invention is to reduce power consumption in a MOS circuit as standby circuit is removed.

To achieve the aforesaid objects the instant invention provides a method for providing compensation against temperature, process and supply voltage variation in MOS circuits comprising the steps of:

sensing said process, temperature or supply voltage variation;

controlling the bulk bias voltage of MOS circuits to maintain the constant threshold voltage; and controlling the drive level to compensate for the effects of said process, temperature or supply voltage variation.

The said controlling the bulk bias voltage is achieved by increasing the voltage of bulk with respect to input diode below said input diode cut in voltage.

The said controlling the drive level is achieved by switching in additional drive transistors to increase or decrease the drive current.

The implementation of said controlling of said bulk bias voltage is done separately for N type semiconductor substrate and P type semiconductor substrate.

The said adjustment of drive includes separate drive control signals for PMOS and NMOS.

An apparatus for providing compensation against temperature, process and supply voltage variation in MOS circuits comprising:

a bulk control circuit connected to N type semiconductor substrate/P type semiconductor substrate of PMOS/NMOS device of said MOS circuit; and a drive control circuit connected to PMOS/NMOS drive control circuit.

The said bulk control circuit includes a plurality of PMOS/NMOS transistors connected to load for providing an output signal for compensating said process, temperature or supply voltage variation.

The said PMOS/NMOS drive control circuit comprises of plurality of PMOS/NMOS transistors connected in parallel with said PMOS/NMOS device of said MOS circuit to increase or decrease the current.

An apparatus for providing compensation against temperature, process and supply voltage variation in CMOS circuits comprising:

a first bulk control circuit connected to N type semiconductor substrate of PMOS device of said CMOS circuit;

a second bulk control circuit connected to P type semiconductor substrate of NMOS device of said CMOS circuit;

a first drive control circuit connected to PMOS drive control circuit; and a second drive control circuit connected to NMOS drive control circuit.

The said first/second bulk control circuits include a plurality of PMOS/NMOS transistors connected to load for providing an output signal for compensating said process, temperature or supply voltage variation.

The said PMOS drive control circuit comprises of plurality of PMOS transistors connected in parallel with said PMOS device of said CMOS circuit to increase or decrease the current.

The said NMOS drive control circuit comprises of plurality of NMOS transistors connected in parallel with said NMOS device of said CMOS circuit to increase or decrease the current.

The said MOS circuit includes Schmitt trigger.

The said MOS circuit includes input buffer.

The present invention provides structures and methods for a very stable MOS circuit. The high and low threshold level are very less sensitive to process, temperature and voltage, which provides stable hysteresis. Different implementation of the method has been presented for low power, high speed and minimum area.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," a well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the invention will become apparent in the following description of non-limiting exemplary embodiments, with reference to the accompanying drawings, in which like reference numerals represent like parts, and in which.

DETAILED DESCRIPTION OF THE INVENTION

FIGS. 4-28, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged circuit control.

Figure 4:
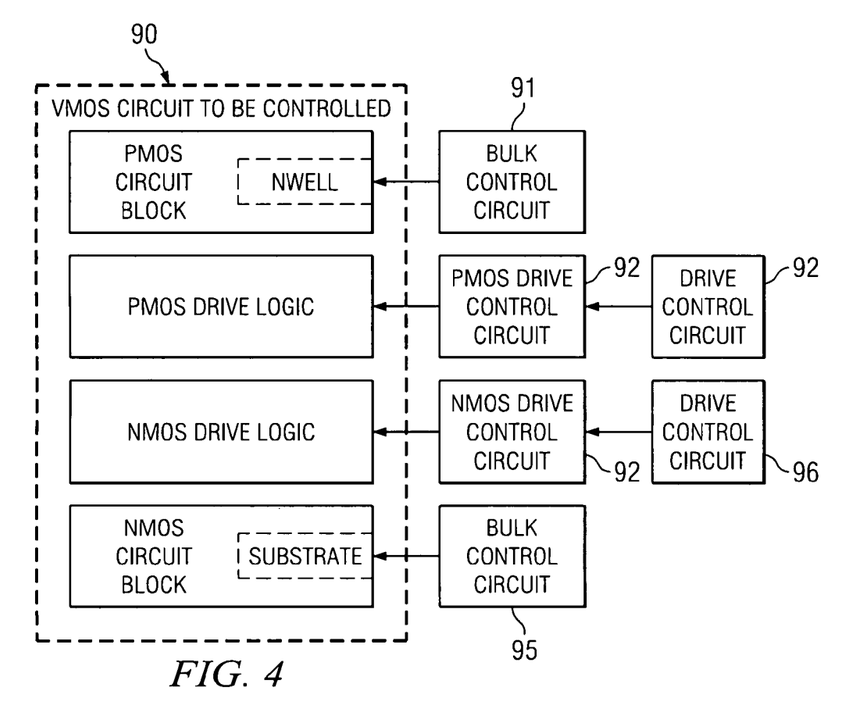
FIG. 4 is block diagram for the threshold voltage control and drive control according to the change in process, voltage and temperature in accordance with the present invention.

This concept can be used to control any type of CMOS circuits that has been shown in FIG. 4 in the form of a block diagram 90.

FIG. 4 shows the new concept for the detection of the change in process, temperature and supply voltage (PVT) and its application in controlling the device characteristic and circuit behavior. The effect of change in threshold voltage and the drive of the devices because of PVT variations are reduced through the PVT detection circuit. The PVT detection circuit includes bulk control circuits 91 & 95 and drive control circuit blocks 92 & 96 to generate the control signals for the substrates of the transistors and for the drive control circuit blocks 93 & 94 respectively. This PVT detection circuit block does not take any input or control signal from the circuit internals. It is completely independent of the modes of operation of the circuits to be controlled. The PVT detection circuit can be different for the body-bias control or the drive control. It is not a limitation of the invention rather it is flexibility for the different possibilities of implementation.

The drive control circuits 92 & 96 are connected to the respective drive controls, 93 and 94, which control the drive level of the MOS circuits.

The detection circuit separately generates four signals, namely, signals for nwell (body of PMOS), substrate (body of NMOS) and two other signals for the control of NMOS drive control circuit 94 and PMOS drive control circuit 93, which can be implemented in several ways. These signals assist in controlling the bulk voltage and drive level in a MOS circuit. Accordingly, a stable threshold voltage is maintained.

The detailed description of the new process insensitive, stable Schmitt trigger circuit (one possible circuit according to the present invention) is presented below. However the invention is not limited to the same and extends to MOS circuits. The invention provides a stable MOS circuit, which is stable against PVT variations.

Figure 5:
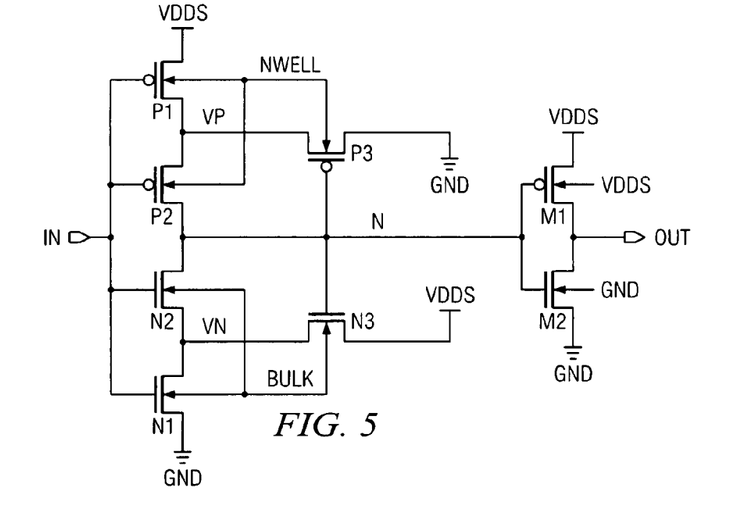
FIG. 5 shows one embodiment of the present invention.

FIG. 5 shows one embodiment of the present invention. It is very much similar to the conventional circuits as far as the structure is concerned. The novelty of the circuit lies in the threshold voltage control of the NMOS and PMOS according to the process in the circuit. Bulk refers to the substrate node of the NMOS transistors N1, N2, & N3, which is of p-type while nwell, refers to the substrate of the PMOS transistors P1, P2 & P3, which is n-type in CMOS process. Vil (High to low transition point) is determined by the ratio P1/P3 along with the NWELL signal. Similarly Vih (Low to high transition point) is determined by the ratio N1/N3 along with BULK signal. The NWELL and BULK signals can be generated by either of the process detection circuits shown in FIGS. 6-9 and FIGS. 10-13 respectively.

Figure 6:
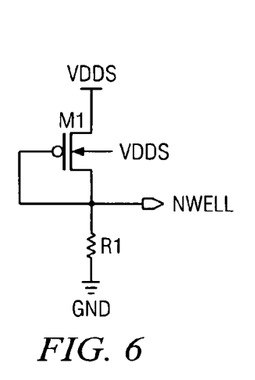
FIGS. 6-9 are schematic diagrams for generation of NWELL signal according to the present invention.

FIG. 6 is a schematic which uses a PMOS transistor M1 having same channel length as devices P1 or P2 or P3, being connected in diode configuration to the supply VDDS in series with a resistor R1. Resistor R1 is required to set the bias current through PMOS M1. In the steady state, signal NWELL would be at VDDS−|VtM1| provided the current through M1 is very low. This NWELL signal is connected to the NWELL of PMOS transistors P1, P2 and P3 of FIG. 5. The PMOS transistors P1, P2 and P3 have source-NWELL and drain-nwell diodes. If the NWELL signal is below (VDDS−|VtP1|), diode formed by source of P1 and NWELL is forward biased and the current flows through resistor R1. If the resistance of the resistor R1 is very high, the current can be reduced.

Figure 8:
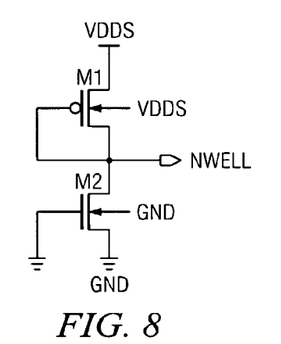

To avoid this dc consumption a grounded gate NMOS transistor M2 can be connected in place of the resistor R1 as shown in FIG. 8. Thus the leakage current of the NMOS transistor M2 provides the ground path. The size of the NMOS transistor M2 is kept large so that the leakage of the NMOS transistor M2 is larger than the leakage of the NMOS transistor M1 in OFF state and the NWELL signal is quickly pulled down to VDDS−|VtM1|. However if biasing current is not large enough, circuit performance is dependent on the frequency of the input data. Thus it is clear that the NWELL signal is dependent on the threshold voltage of the PMOS M1 that is again dependent on temperature and process. If process gets slow during fabrication, absolute threshold voltages of the PMOS transistors P1, P2 and P3 increases and change the value of voltage Vil. To keep Vil intact, threshold voltages of these PMOS must be decreased. Since increased |VtM1| decreases the NWELL signal value which is connected to the NWELL of the PMOS transistors P1, P2 and P3, the bulk to source voltage |Vsb| decreases. Further this decreases the threshold voltages of the PMOS transistors P1, P2 and P3 against process variation and hence try to neutralize the effect of the process variation.

Figure 7:
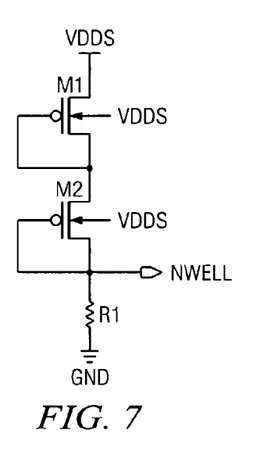
Figure 9:
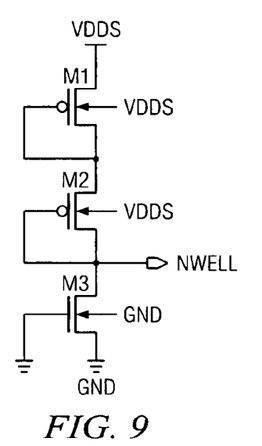

The threshold voltage equation of a MOSFET is $Vth=Vth0+Y(SQRT(|2*PHI+Vsb|)-SQRT(|2*PHI|))$ which includes the body effect. Vth0 is the threshold voltage when Vsb is zero that is body effect is not present. To further increase the insensitivity of the trip point with respect to process variation, two series PMOS transistors M1 and M2 can be used as shown in FIGS. 7 and 9. In these circuits a small change dVth will result in 2*dVth change in the NWELL signal and hence better control. Since the relationship of Vsb and Vth is not linear, complete neutralization cannot be achieved. If FIG. 9 is used to generate NWELL signal, the stability of Vil increases. The effect of temperature and voltage is similar to the process. If the temperature increases, the threshold voltage of device would fall, which would increase the NWELL signal value and hence the threshold voltage of the PMOS transistors P1, P2 and P3 would increase to counterbalance the effect of increased temperature.

As the input signal IN falls, the NWELL signal also changes as shown in the FIG. 19 below. It is clear that as temperature increases, NWELL increases to increase the Vth of the PMOS transistors P1, P2 and P3. When OUT makes a transition NWELL also makes transition and settles at some value to stop dc current through parasitic diodes.

Figure 19:
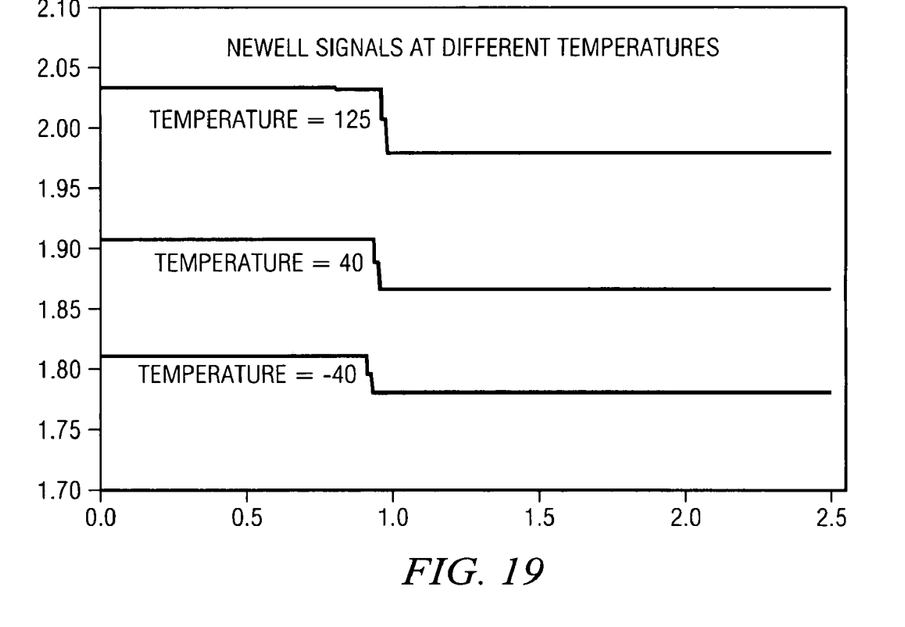
FIG. 19 shows the waveforms of NWELL signal vs VIN signal.

In FIG. 19, NWELL signal is low when IN is at high. It is because the PMOS transistor P3 is ON and channel-nwell also forms a diode increasing leakage current through bulk. Once the transition is complete, the input signal IN is low and node N is high which turns the PMOS transistor P3 OFF. This reduces the number of parallel paths for current through NWELL and hence the NWELL signal rises.

Figure 20:
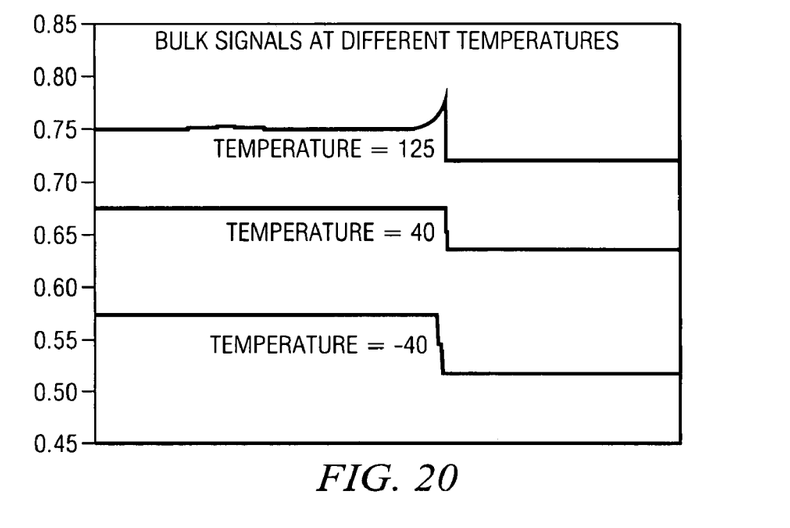
FIG. 20 shows the waveforms of BULK signal vs VIN signal.
Figure 21:
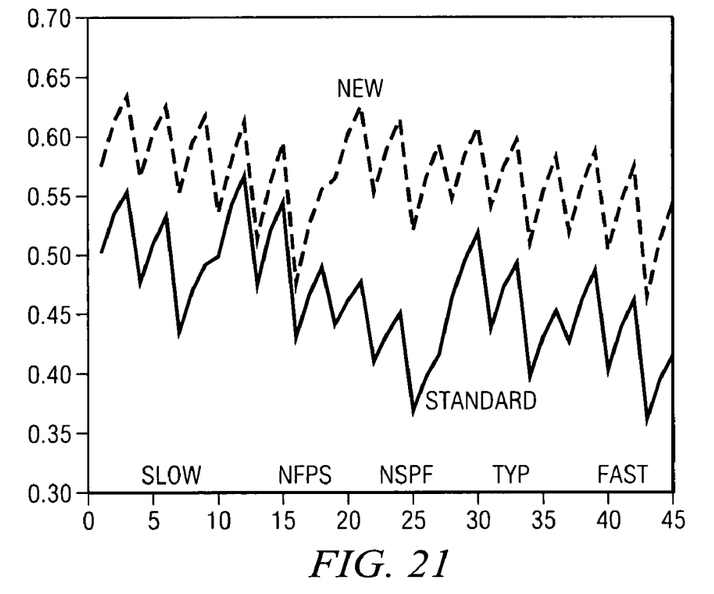
FIG. 21-28 show the simulation results of the new circuit in contrast with the standard circuit.
Figure 22:
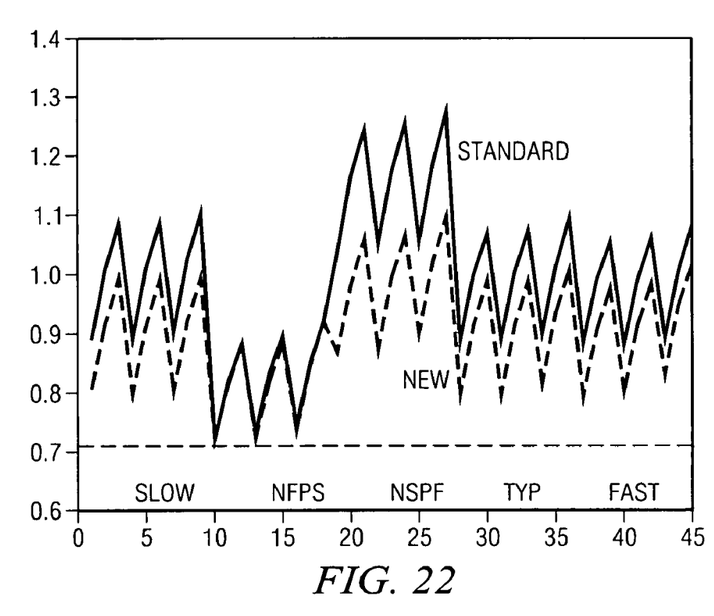
Figure 23:
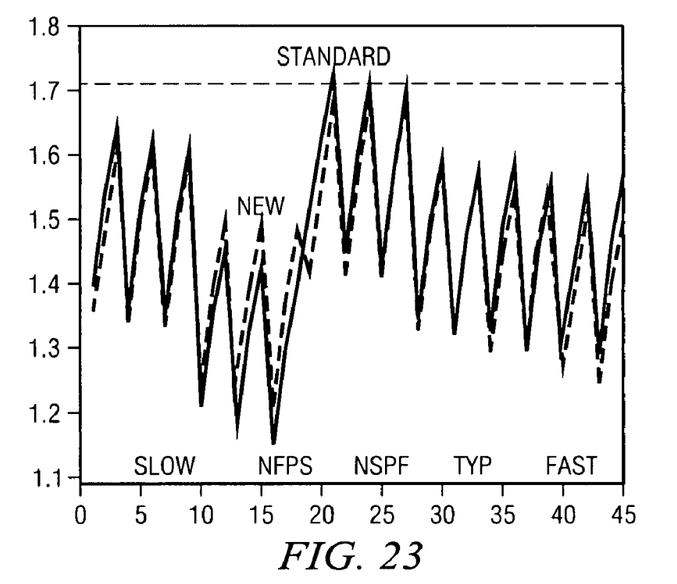
Figure 24:
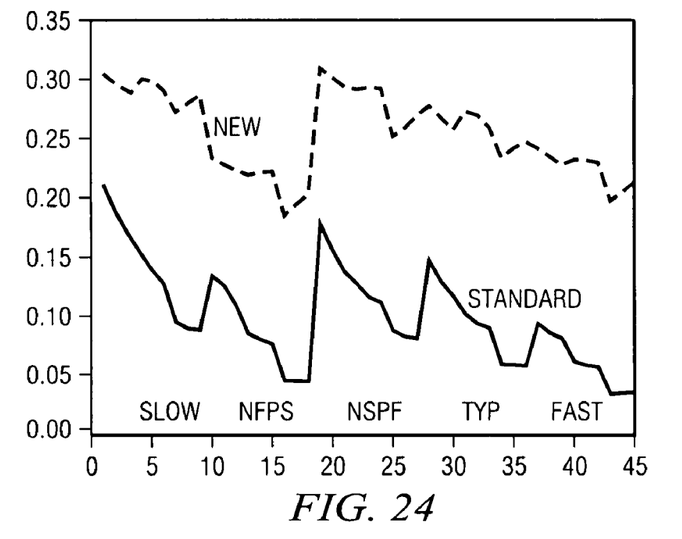
Figure 25:
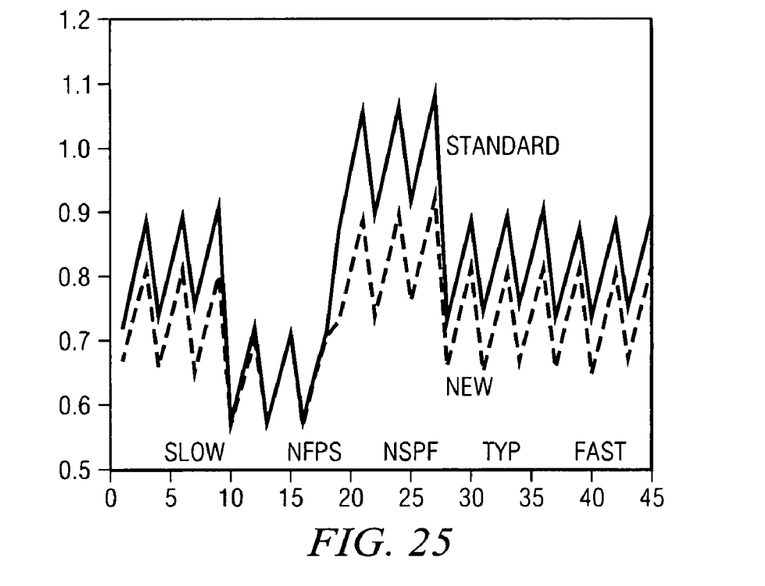
Figure 26:
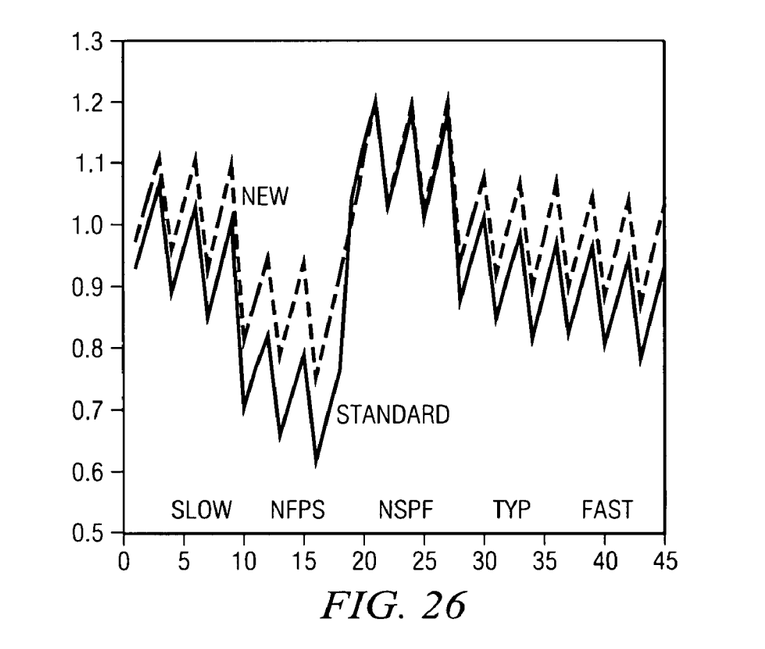

FIGS. 10 to 13 are circuits to generate BULK signal for the control of NMOS N1, N2 and N3. Here Vih is determined by the ratio N1/N3 and BULK signal. Similar to the NWELL control, BULK control is obtained. From the figures it is clear that when threshold voltage of NMOS increases either because of process or temperature variation, the BULK signal (which is proportional to the VtM1 and VtM2) increases and the threshold voltages of the NMOS transistors N1, N2 and N3 decreases to stabilize the Vih. Similar to the NWELL control, better BULK control is achieved by circuit in FIGS. 11 and 13. As the input signal IN rises, the BULK signal changes because of turn ON/OFF of the NMOS transistor N3 as shown in FIG. 20.

In this way the new circuit with threshold control detects the change in process, temperature and voltage and controls the bulk and NWELL of the devices to neutralize the effect of the variation and therefore provides a very stable Schmitt trigger circuit.

In short, the invention provides a self-adjusting circuit for bulk control in MOS devices against the PVT (process, voltage and temperature) variation. When process is slow, absolute threshold voltage of all the devices increases and Vil shifts towards ground while Vih shifts towards supply (VDDS). It increases the hysteresis, but decreases noise margin. For any standard, minimum value of Vil is fixed and maximum value of Vih is also fixed to take care of low and high logic level noise margins (For TTL level Vil (min)=0.8 Volt and Vih (max)=2.0 Volt according to the designer specifications). To meet the standards, the circuit is set to these values in the worst possible case. For example Vil is minimum when all the PMOS transistors are slow and all the NMOS transistors are fast while voltage and temperature is minimum, Vih is maximum when all the NMOS transistors are slow and all the PMOS transistors are fast while voltage and temperature are maximum. In such a case, hysteresis obtained is very low. At low supply voltages the required hysteresis is not easily achieved or very low with the conventional circuits. Since threshold voltage of the NMOS and PMOS transistors play major role at the device level in determining the Vil and Vih, it is easy to stabilize the hysteresis if the threshold voltages of the MOSFETS can be controlled according to the PVT variation.

Figures 10, 11, 12, 13, 14:
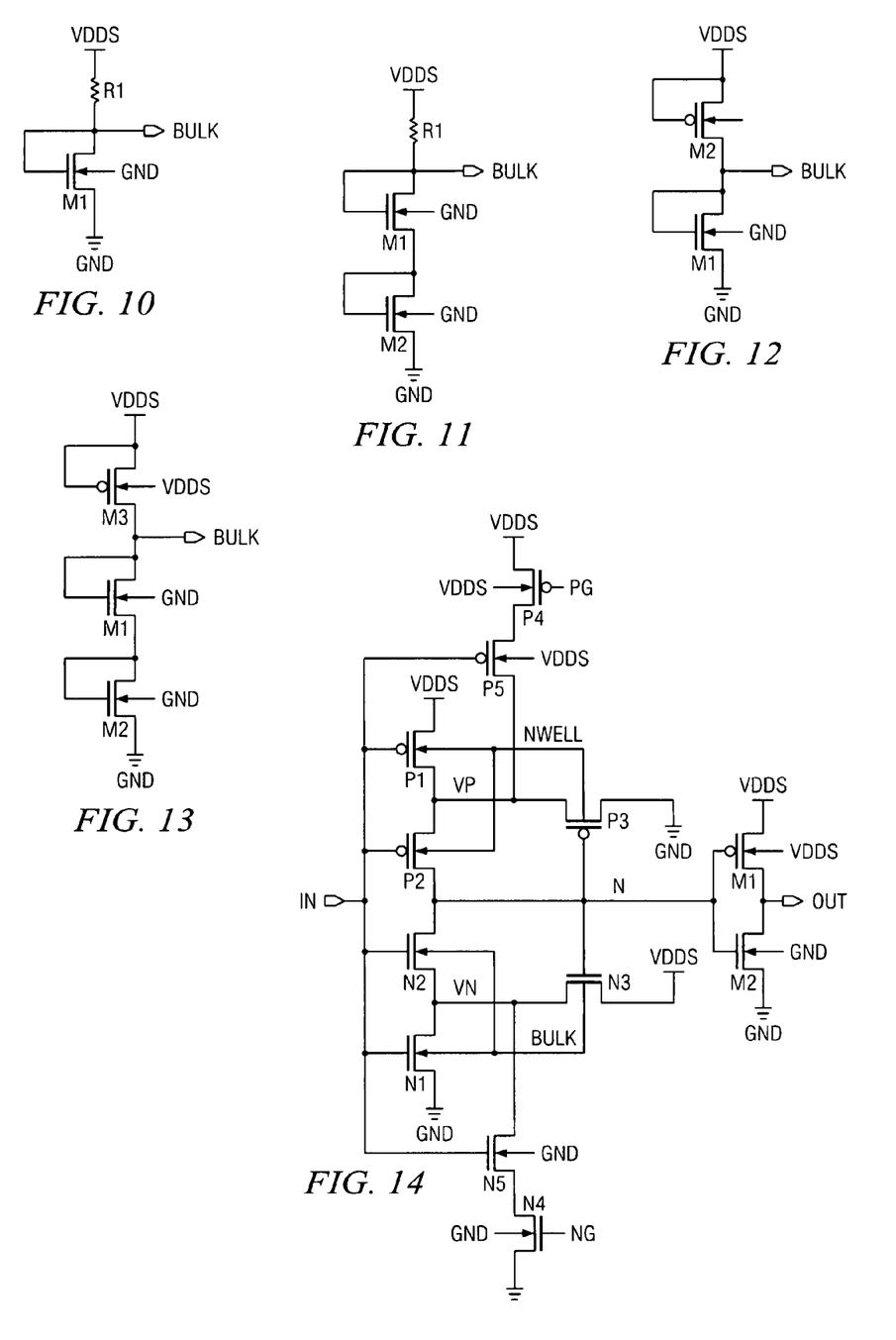
FIGS. 10-13 are schematic diagrams for generation of bulk control signal according to the present invention.
FIG. 14 shows another embodiment of the invention using bulk control as well as drive control circuits in accordance with the invention.

FIG. 14 is the new Schmitt trigger circuit employing a circuit to control the current drive of the circuit while maintaining the threshold voltage. As the process gets slow the drive of the devices reduces. Further increment in temperature also makes the devices slow because of mobility degradation. Increment in supply voltages increases the current and changes the trip point. All these effects are controlled through additional circuit as shown in the figure. A series combination of two PMOS transistors P4 and P5 are added in parallel with the PMOS transistor P1 to increase or decrease the current according to the PVT variation. The gate of the PMOS transistor P5 is connected to the IN input signal and the gate of the PMOS transistor P4 is connected to the PVT detection circuit that generates the signal PG.

Similarly a series combination of two NMOS transistors N4 and N5 are connected in parallel with the NMOS transistor N1. The gate of the NMOS transistor N5 is connected to the input signal IN and the gate of the NMOS transistor N4 is connected to another process detecting circuit that generates signal NG. MOSFETS M1 and M2 form an inverter to provide sharp transition at the output OUT. Bulk of the NMOS transistors N1, N2 and N3 are connected to the signal BULK as described earlier while the bulk of PMOS transistors P1, P2 and P3 are connected to the signal NWELL as described earlier. The bulk control has already been discussed earlier, only the drive control will be discussed and its effect will be explained in detail.

When the input signal IN is low, the PMOS transistors P1, P2 and P5 are ON. The PMOS transistor P4 is also ON because its gate is connected to the PG signal that is generated by the circuit shown in FIG. 15 or 16. The circuits for PG signal generation are similar to that of NWELL signal generation. PG voltage would be (VDDS−|VtM1|−|VtM2|) provided current through the PMOS transistors M1, M2 and M3 (FIG. 16) is very low. Thus the PMOS transistor P4 is always ON.

Figure 15:
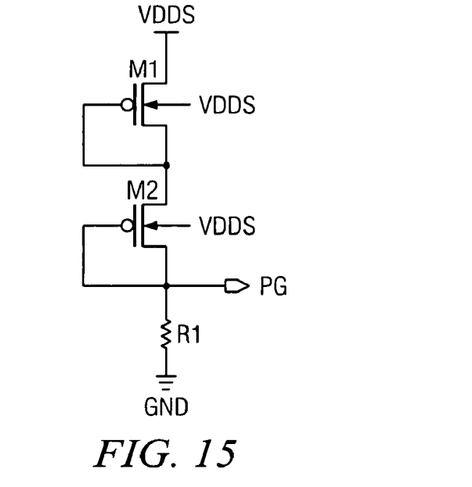
FIGS. 15 to 18 are schematic diagrams for generation of drive control signal according to the present invention.
Figure 16:
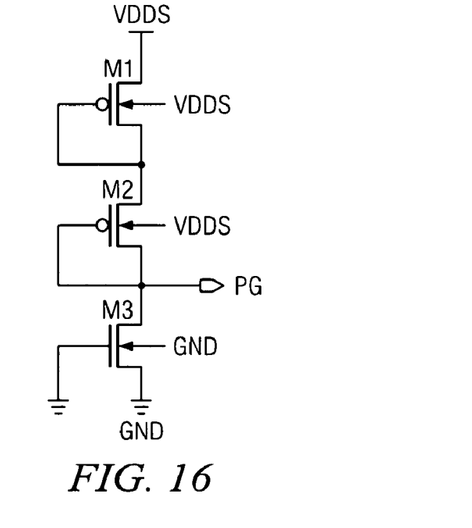

Gate voltage PG changes according to the PVT variation. As the input signal IN falls, the PMOS transistors P1 and P5 turn ON and start charging the node VP. The voltage Vil is determined by ratio (P1+P5)/P3 along with NWELL and PG signal. When process gets slow or temperature increases, drive of devices decreases that shift the Vil level towards GND or Vil should decrease. However, since the signal PG also decreases and increases the drive of the PMOS transistor P4 and sources more current through the PMOS transistor P5 the effect of temperature or process is counterbalanced. If voltage increases to increase the drive, PG also increases to decrease the drive of P4 and hence current is controlled. In this way the effect of PVT variation on current drive is neutralized up to certain extent and hence relatively more stable Vil is achieved.

Figure 17:
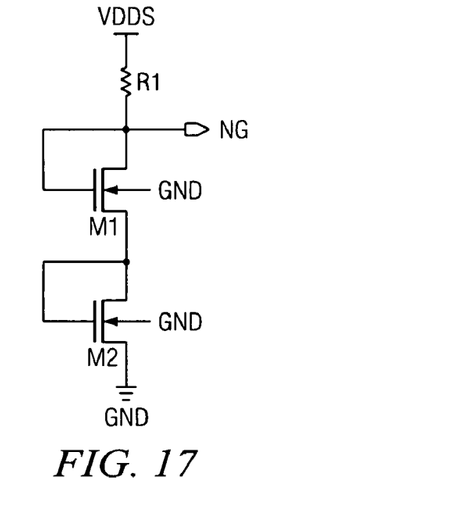
Figure 18:
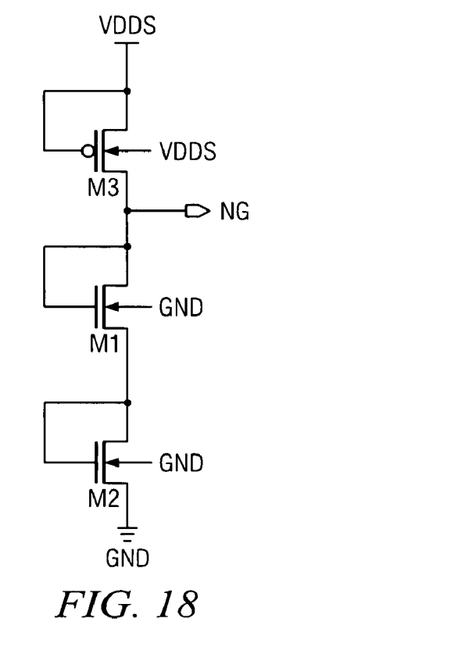

When the input signal IN is high, the NMOS transistors N1, N2 and N5 are ON. The NMOS transistor N4 is also ON because gate is connected to the NG signal that is generated by circuit in FIG. 17 or 18. These circuits for NG signal are similar to that of BULK. NG voltage will be (VtM1+VtM2) provided current through the NMOS transistors M1, M2 and M3 is very low. Thus transistor N4 is always ON. Gate voltage NG will change according to the PVT variation. As IN rises, the NMOS transistors N1 and N5 turn ON first and start charging the node VN. The voltage Vih is determined by ratio (N1+N5)/N3 along with BULK and NG signal. When process gets slow or temperature increases, drive of devices decreases that should shift the Vih level towards VDDS or Vih should increase. However, since signal NG goes up and increases the drive of the NMOS transistor N4 and sinks more current through the NMOS transistor N5, the effect of the temperature or process is counterbalanced. In this way effect of process and temperature on current drive is neutralized up to certain extent and hence relatively more stable Vih is achieved.

From the above explanation it is clear that threshold and current drive control will lead to a very stable Schmitt trigger circuit than any other method. Cad results are given in the next section to prove the stability of the new circuit.

Simulation Results

Under this section, simulation results have been presented and compared against the standard architecture, which is widely accepted.

For all the graphs shown below, x-axis represents the PVT variation, where process, voltage and temp are varying together. There are 45 cases of PVT (all possible combinations of 3-voltages, 3-temp and 5-process) for which graphs have been plotted. SLOW indicates the process when the PMOS transistor and the NMOS transistor both are slow (3-sigma). NFPS indicates the process when NMOS is fast (6-sigma) and PMOS is slow (6-sigma). NSPF indicates the process when NMOS is slow (6-sigma) and PMOS is fast (6-sigma). TYP indicates the centered process. FAST indicates the process when NMOS and PMOS both are fast (3-sigma).

All the graphs in FIG. 21 to 26 are plotted for the Schmitt structure with bulk/nwell control only. All the plots clearly show the remarkable improvement over standard structure across PVTs. For low voltage (1.8 volt) the minimum improvement is 50% for hysteresis.

Figure 27:
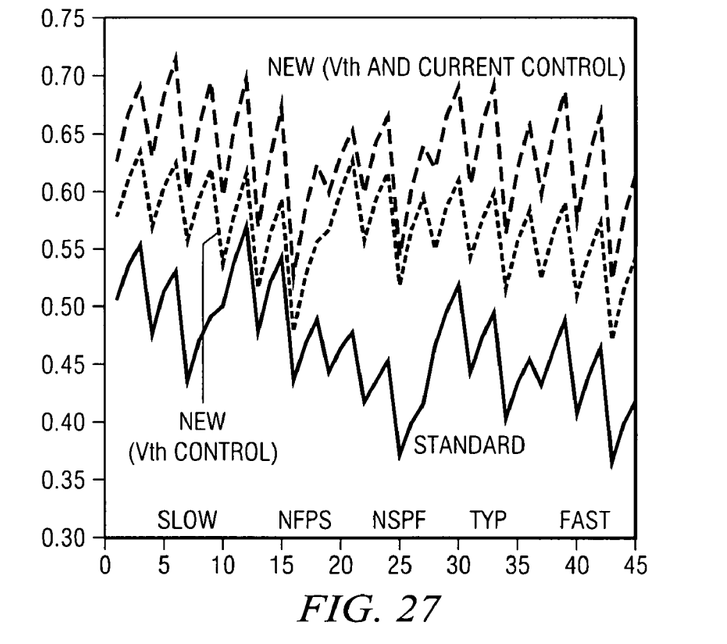
Figure 28:
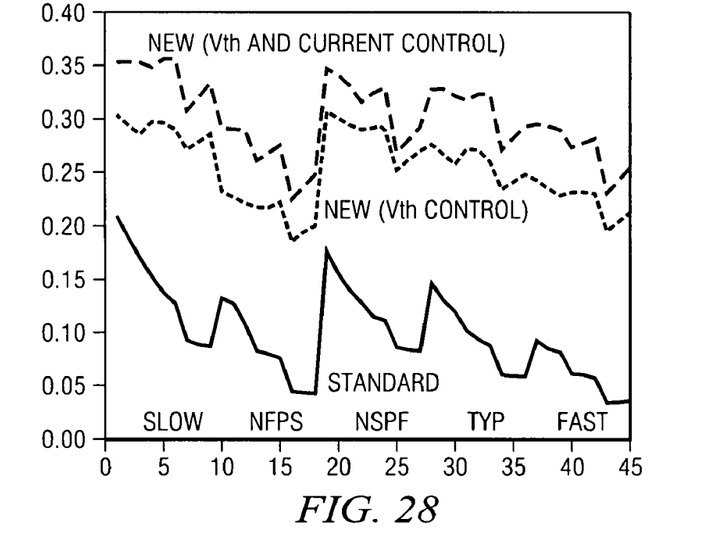

The graphs shown in FIGS. 27 and 28 compare the standard structure with the new circuit with Vth (threshold voltage of MOSFETES) control and the new circuit with Vth and current control respectively. It is intended that the present invention encompass such changes and modifications as fall within the scope of the appended claims.

What is claimed is:

1. A method for providing compensation against temperature, process and supply voltage variation in a metal-oxide-semiconductor (MOS) circuit, comprising the steps of:
    sensing at least one of a process, temperature and supply voltage variation;
    controlling a bulk bias voltage of a MOS circuit according to the at least one variation to maintain a constant threshold voltage; and
    controlling a current drive level of the MOS circuit according to the at least one variation to compensate for effects of said process, temperature or supply voltage variation.

2. The method as claimed in claim 1 wherein controlling the bulk bias voltage further comprises increasing the bulk bias voltage with respect to an input diode below said input diode's cut in voltage.

3. The method as claimed in claim 1 wherein said MOS circuit comprises a drive transistor and controlling the drive level further comprises controlling said drive transistor according to the at least one variation to increase a drive current.

4. The method as claimed in claim 2 wherein said MOS circuit comprises an N type semiconductor substrate and a P type semiconductor substrate and controlling said bulk bias voltage further comprises controlling a bulk bias voltage of said N type semiconductor substrate and separately controlling a bulk bias voltage of said P type semiconductor substrate.

5. The method as claimed in claim 3 wherein said MOS circuit further comprises an NMOS drive circuit and a PMOS drive circuit and controlling said current drive level further comprises controlling a current drive level for said NMOS drive circuit and separately controlling a current drive level for said PMOS drive circuit.

6. An apparatus for providing compensation against temperature, process and supply voltage variation in a metal-oxide-semiconductor (MOS) circuit, the apparatus comprising:
    a bulk control circuit electrically coupled to a semiconductor substrate of a MOS device of said MOS circuit, said bulk control circuit configured to control a bulk bias voltage of said MOS circuit according to at least one of a process, temperature and supply voltage variation; and
    a drive control circuit electrically coupled to said MOS device, said drive control circuit configured to control a current drive level of said MOS circuit according to at least one of a process, temperature and supply voltage variation.

7. The apparatus as claimed in claim 6 wherein said bulk control circuit includes a plurality of MOS transistors electrically coupled to said semiconductor substrate, wherein said plurality of MOS transistors is configured to produce a signal for compensating for said at least one variation.

8. The apparatus as claimed in claim 6 wherein said drive control circuit comprises a plurality of MOS transistors electrically coupled in parallel with said MOS device of said MOS circuit, wherein said plurality of MOS transistors is configured to increase or decrease a drive current of said MOS device of said MOS circuit.

9. The apparatus as claimed in claim 6 wherein said MOS circuit includes a Schmitt trigger.

10. The apparatus as claimed in claim 6 wherein said MOS circuit includes an input buffer.

11. The apparatus as claimed in claim 6, wherein the MOS circuit comprises a drive transistor and the drive control circuit controls the current drive level by controlling the drive transistor to decrease a drive current.

12. The method as claimed in claim 1 wherein said MOS circuit comprises a drive transistor and controlling the drive level further comprises controlling said drive transistor according to the at least one variation to decrease a drive current.

13. The method as claimed in claim 1 wherein said MOS circuit includes a Schmitt trigger.

14. The method as claimed in claim 1 wherein said MOS circuit includes an input buffer.

15. An apparatus for providing compensation against temperature, process and supply voltage variation in a complimentary metal-oxide-semiconductor (CMOS) circuit, the apparatus comprising:
    a first bulk control circuit electrically coupled to an N type semiconductor substrate of a PMOS device of said CMOS circuit;
    a second bulk control circuit electrically coupled to a P type semiconductor substrate of an NMOS device of said CMOS circuit;
    a first drive control circuit electrically coupled to said PMOS device of said CMOS circuit, said first drive control circuit configured to control a current drive level of said PMOS device of said CMOS circuit according to at least one of a process, temperature and supply voltage variation; and
    a second drive control circuit electrically coupled to said NMOS device of said CMOS circuit, said second drive control circuit configured to control a current drive level of said NMOS device of said CMOS circuit according to said at least one of a process, temperature and supply voltage variation.

16. The apparatus as claimed in claim 15 wherein at least one of said first and second bulk control circuits include a plurality of MOS transistors electrically coupled to said semiconductor substrate electrically coupled to said at least one first and second bulk control circuit, wherein said plurality of MOS transistors is configured to produce a signal for compensating for said at least one variation.

17. The apparatus as claimed in claim 15 wherein said first drive control circuit comprises a plurality of PMOS transistors electrically coupled in parallel with said PMOS device of said CMOS circuit, wherein said plurality of PMOS transistors is configured to increase or decrease a drive current of said PMOS device of said CMOS circuit.

18. The apparatus as claimed in claim 15 wherein said second drive control circuit comprises a plurality of NMOS transistors electrically coupled in parallel with said NMOS device of said CMOS circuit, wherein said plurality of NMOS transistors is configured to increase or decrease a drive current of said NMOS device of said CMOS circuit.

19. The apparatus as claimed in claim 15 wherein said CMOS circuit includes a Schmitt trigger.

20. The apparatus as claimed in claim 15 wherein said CMOS circuit includes an input buffer.

* * * * *